United States Patent
Kuznetsov et al.

(10) Patent No.: US 6,561,798 B2
(45) Date of Patent: May 13, 2003

(54) APPARATUS FOR PROCESSING A WAFER

(75) Inventors: Vladimir Ivanovich Kuznetsov, Delft (NL); Bartholomeus Hans L. Lindeboom, Bilthoven (NL); Ronald Bast, Leusden (NL); Christianus Gerardus M. de Ridder, Hoogland (NL)

(73) Assignee: ASM International N.V., Bilthoven (NL)

( * ) Notice: Subject to any disclaimer, the term of this patent is extended or adjusted under 35 U.S.C. 154(b) by 52 days.

(21) Appl. No.: 09/875,277

(22) Filed: Jun. 6, 2001

(65) Prior Publication Data

US 2002/0024003 A1 Feb. 28, 2002

(30) Foreign Application Priority Data

Jun. 7, 2000 (NL) .............................................. 1015397

(51) Int. Cl.[7] .............................................. H01L 21/68
(52) U.S. Cl. ........................ 432/249; 414/754; 414/936
(58) Field of Search .......................... 432/249; 414/754, 414/757, 772, 778, 779, 769, 936; 356/400; 219/209, 390

(56) References Cited

U.S. PATENT DOCUMENTS

| | | | |
|---|---|---|---|
| 4,819,167 A | 4/1989 | Cheng et al. | |
| 4,987,856 A | 1/1991 | Hey et al. | |
| 5,044,752 A | 9/1991 | Thurfjell et al. | |
| 5,054,991 A | 10/1991 | Kato | |
| 5,563,798 A | 10/1996 | Berken et al. | |
| 5,740,034 A * | 4/1998 | Saeki | 414/783 |
| 5,980,194 A * | 11/1999 | Freerks et al. | 414/754 |
| 6,162,008 A * | 12/2000 | Perkins et al. | 414/754 |
| 6,217,212 B1 * | 4/2001 | Brenninger et al. | 414/936 |
| 6,370,793 B1 * | 4/2002 | Chae et al. | 414/936 |

FOREIGN PATENT DOCUMENTS

| | | |
|---|---|---|
| EP | 0 821 403 A2 | 1/1998 |
| EP | 0 915 498 A2 | 5/1999 |
| JP | 10 214876 | 8/1998 |
| NL | 1003538 | 1/1998 |
| WO | WO 98/57359 | 12/1998 |

* cited by examiner

*Primary Examiner*—Gregory Wilson
(74) *Attorney, Agent, or Firm*—Weingarten, Schurgin, Gagnebin & Lebovici LLP

(57) ABSTRACT

An apparatus for thermally processing a wafer at an elevated temperature, in which a processing position is bounded at least on one side by a housing part which, in use, is at an elevated temperature, the apparatus being provided with measuring means for determining the position of a wafer in the processing position before and/or during processing, the measuring means being provided with at least one signal processor and at least one signal conductor, the or each signal processor being located at a distance from the processing position in an area of lower temperature, the signal conductor extending through the housing part being at an elevated temperature and extending from a measuring point in or near the processing position to the signal processor for transmitting to the signal processor contactlessly obtained measuring signals, the at least one signal conductor, at least the part extending through the housing part being at an elevated temperature, being heat resistant.

26 Claims, 4 Drawing Sheets

APPARATUS FOR PROCESSING A WAFER

The invention relates to an apparatus for thermally processing a wafer at an elevated temperature, the apparatus having at least one processing position, the or each processing position being bounded at least on one side by a housing part which, during use, is at an elevated temperature.

An apparatus for processing wafers in which the processing position is bounded by housing parts at an elevated temperature has been described in, for example, Dutch patent 1003538 in applicant's name. The processing of a wafer can comprise, for instance, deposition or etching of material, or annealing or implantation of doping. Such wafer processing takes place at a processing temperature which is usually above room temperature, and, in some processing operations, may well involve a value in excess of 1000° C. In this known apparatus, the processing position is formed by a process chamber having such dimensions that it encloses the wafer very tightly. For this reason, the wafer should be positioned accurately in the process chamber during loading and during processing, so that damage to the wafer is prevented. Damage can occur during loading, when the wafer, as a result of an incorrect positioning, contacts a wall of the process chamber. Moreover, the wafer and/or the apparatus can be damaged as a consequence of an incorrect positioning of the wafer during processing, e.g. because the wafer drops from wafer support means on which the wafer rests during processing. Usually, during processing, a wafer is rotated around its center to increase the uniformity of the processing. This rotation must be terminated after processing, so that the wafer can be taken out of the process chamber by wafer transport means. If the wafer still rotates, the contact between the wafer and the wafer transport means can also lead to damage to the wafer and the wafer transport means. In the apparatus known from the Dutch publication, the wafer is supported during processing by a gas bearing, so that there is no mechanical contact.

From the above it will be apparent that there is a need to measure the position and the possible rotation of the wafer prior to and/or during the processing operation.

The object of the invention is to provide an apparatus for processing a wafer of the type described in the preamble, in which contactless measurement of the position of the wafer in the processing position can take place.

To this end, the invention provides an apparatus of the type described in the preamble, which is characterized in that the apparatus is provided with measuring means for determining the position of a wafer in the processing position prior to and/or during processing, the measuring means being provided with at least one signal processor and at least one signal conductor, the or each signal processor being located at a distance from the processing position in an area of lower temperature, the signal conductor extending through or over the housing part being at an increased temperature and extending from a measuring point in or adjacent the processing position to the signal processor for transmitting to the signal processor contactlessly obtained measuring signals originating from the measuring point, while the at least one signal conductor, at least the part extending through or over the housing part being at an increased temperature, is heat resistant.

As the measuring signals are contactlessly obtained, the wafer can be situated contactlessly in the processing position during processing, for instance in that it is supported by a gas bearing. However, this is not requisite, the wafer can also rest on a support element. To determine the position of the wafer, however, mechanical contact with the wafer is not necessary.

As the signal conductors are heat resistant, they can extend through a housing part being at an elevated temperature, so that the signal, obtained contactlessly, can be conducted from the area being at an elevated temperature to an area where a lower temperature prevails, where the signal processor is safely arranged.

According to a further elaboration of the invention, housing parts being at an elevated temperature can be provided on opposite sides of the or each wafer processing position. Thus, a good heat transfer to the wafer can be realized.

Additionally, according to a further elaboration of the invention, signal conductors can extend through or over both housing parts, while signal conductors, at least the parts extending through or over the housing parts being at an elevated temperature, are heat resistant.

The signal conductors extending through or over a first housing part can, for instance, be connected to a signal source, and the signal conductors extending through or over a second housing part can be connected to a signal processor.

According to a further elaboration of the invention, the or each signal processor can comprise an optical sensor, the or each signal conductor, at least the part extending through or over a housing part being at an elevated temperature, being manufactured from light conducting, heat resistant material. The light conducting, heat resistant material can be, for instance, quartz glass.

In this further elaboration, the signal source is preferably a light source. Outside the housing parts being at an elevated temperature, the signal conductors can be designed as glass fiber cable.

The signal conductors conduct the light originating from the light source to the measuring points, which are located preferably near the intended position of the wafer edge. Insofar as the edge of the wafer does not completely cover the measuring point, light is passed wholly or partly and fed via signal conductors to the at least one optical sensor. On the basis of the electric signal produced by the optical sensors, the position of the wafer can be determined. Because the optical sensors and the light source are situated at a distance from the processing position, these will not, during processing, come into contact with, for instance, a processing gas or a processing temperature which could damage the sensors or the light source.

A wafer which has been heated, for instance by the processing temperature of a wafer processing operation, also emits light itself. This can complicate the optical detection of the wafer edge which is lit up for detection in the process chamber. To resolve this problem, the light source can for instance emit modulated light. What is meant by modulated light is light whose intensity varies periodically. This modulated light, together with the unmodulated light emitted by the heated wafer, is detected by the optical sensors and converted into a sensor signal. The amount of modulated light in the sensor signal can then be calculated through simple signal processing.

In an alternative embodiment, the or each signal processor can comprise a pneumatic pressure sensor or acoustic sensor, the or each signal conductor, at least the part extending through a housing part being at an elevated temperature, comprising a fluid passing channel in said housing part, which channel is in fluid communication with the pneumatic pressure sensor or acoustic sensor. Further, the signal source can comprise a pneumatic pressure source or a sound source. The pneumatic pressure source can be, for instance, an inert gas source, feeding gas through a fluid passing channel to the processing position. The pneumatic pressure source can also be formed by the gas being fed to the processing position for processing the wafer. The pneumatic pressure sensor can, for instance, measure the gas pressure in the above-mentioned gas feeding, fluid passing channel. If the wafer partly covers the exit of the gas feeding fluid passing channel, the pressure in that channel will increase, which is an indication for the position of the wafer. However, it is also possible that in an opposite housing part a second fluid passing channel is present, extending in alignment with the first channel, in which the gas pressure is measured by means of the pneumatic pressure sensor. If the wafer partly covers this second channel, the gas pressure in it decreases, which is also an indication for the position of the wafer.

When use is made of a sound source and an acoustic sensor, the amount of sound is measured which is passed or reflected through the fluid channel which may or may not be partly covered by the wafer.

It will be clear that also in this alternative elaboration a contactless measurement takes place and that the signal of the measurement is conducted by the heat resistant signal conductor in the form of a fluid channel from the processing position to a signal processor which is in a friendlier environment.

'Elevated temperature' is herein to be understood to mean a temperature of over 200° C., more in particular over 400° C.

In some apparatuses which are provided with two housing parts being at an elevated temperature, these housing parts are arranged so that they can be moved away from and towards each other. Such an embodiment enables the positioning of the wafer in the processing position, while, in operation, a substantially fully closed process chamber can be used. According to a further elaboration of the invention, it is particularly favorable when the apparatus is provided with a control comprising or being connected to the or each signal processor, the control being arranged to operate the movement away from and toward each other of the first and second housing parts, while the control can solely give a command for the movement toward each other of the housing parts when the signal processor determines that the wafer is in the correct position or when the signal processor determines that there is no wafer present in the processing position. This prevents the housing parts from moving towards each other while the wafer is not yet in the correct position. If the latter should happen, it could have disastrous consequences, necessitating, for instance, a revision of the apparatus.

The control is preferably arranged to control, on the basis of the measuring signals, transport means for correcting the position of the wafer, so that the wafer is placed in the desired position. With the aid of the control, loading the wafer into the apparatus can be carried out automatically and accurately.

Possibly, in a housing part as mentioned, gas feed channels can be arranged for forming a gas bearing in the processing position. With such a gas bearing, there is the danger that the wafer displaces laterally in the processing position, so that the wafer loses its desired position. To prevent this, an apparatus of such design can be provided with a control comprising or being connected to the or each signal processor, the control being arranged for regulating the gas flow in the gas feed channels, the gas flow being regulated depending on measuring signals determined by the signal processor, in such a manner that the wafer maintains the correct position during processing.

Thus, during processing, the correct position can be maintained without the wafer contacting any mechanical part.

Furthermore, the gas flows for forming the gas bearing can be such, that the wafer rotates during processing, while the control is arranged for determining, depending on the measuring signals processed by the signal processor, the speed of rotation of the wafer, the control being arranged for regulating the gas flow for obtaining the desired rotational speed.

In order to be able to accurately determine the position and the rotation, according to a further elaboration of the invention, the apparatus is provided with at least three measuring points. These measuring points are preferably situated at the intended position of the wafer edge in the processing position. Preferably, the or each signal processor is arranged to determine the extent to which the measuring point is covered by the wafer being in the processing position.

It is noted that from WO98/57359 an apparatus for processing a wafer at an elevated temperature is known, in which the wafer, during processing, is supported by a wafer support pedestal, in which pairs of electrodes are incorporated for determining, by means of a capacitance measurement, the presence and absence as well as the position of the wafer. The value of the capacitance of a pair of electrodes is influenced by the presence of the wafer and the position of the wafer in the processing position.

A drawback of the known apparatus is that the wafer makes contact with or is located at a small distance from the pairs of electrodes. Not nearly in all thermal processing operations is such contact or exposure to electrode material allowable or desirable. The measuring means known from the above mentioned international patent application which are based on mechanical contact with, or at least exposure to pairs of electrodes are therefore not suitable for determining the position of the wafer in the wafer processing furnace from the Dutch publication.

Moreover, the international publication does not describe how the signals of the pairs of electrodes are conducted to the signal processor. Especially when the processing position is bounded by housing parts being at a very strongly elevated temperature, for instance a temperature of over 600° C., this signal conduction is a problem. For this problem, the present invention also offers a solution.

In elucidation of the present invention, an exemplary embodiment will be described with reference to the drawing. In the drawing.

Figure 1:
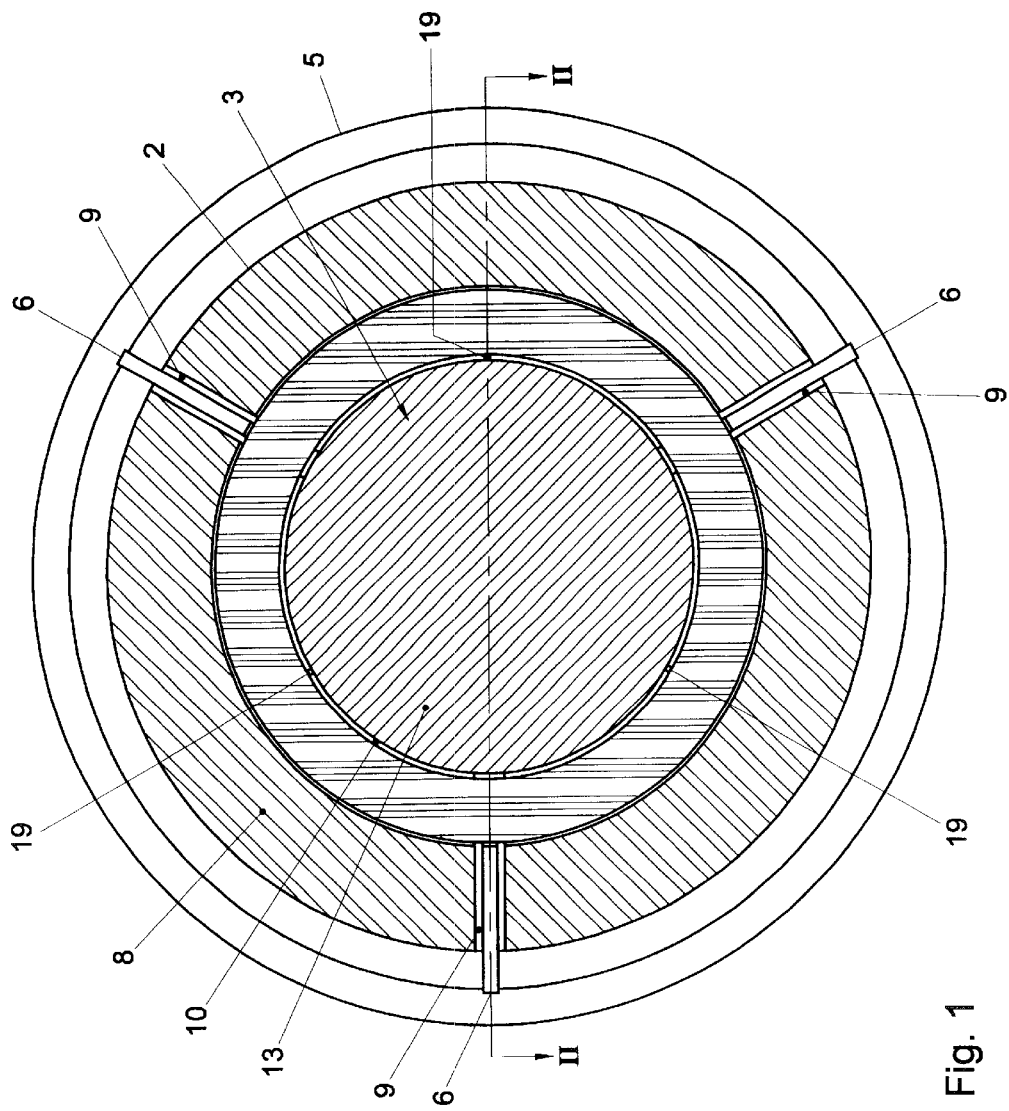
FIG. 1 shows a top view of an exemplary embodiment of the invention, in which a first housing part, a first and a second wall have not been represented.

The exemplary embodiment represented in the Figures is provided with a first and a second housing part 1 and 2, respectively. The two housing parts 1, 2 are arranged for movement towards and away from each other together with the first and second cool wall 11 and 12, respectively, which are insulated from the housing parts by means of insulation material. In the present exemplary embodiment, the insulation is formed by a hollow space. However, it is also possible for this hollow space to be filled with insulation material. In a position when moved towards each other, the housing parts 1, 2 bound a process chamber 3, the housing parts 1, 2 contacting or almost contacting each other around the process chamber 3 in boundary surfaces 8. Each boundary surface 8 is provided with three wafer transport means receiving grooves 9, extending radially to the center of the, respective, housing part 1, 2. The wafer transport means receiving grooves 9 of the first housing part 1 are positioned opposite the wafer transport means receiving grooves 9 of the second housing part 2, thus forming three pairs of wafer transport means receiving grooves 9. The central axes of the three pairs of wafer transport means receiving grooves 9 enclose angles of 120 degrees relative to each other.

The sides of the two housing parts 1, 2 facing each other each provide a circular processing surface 13 in the process chamber 3. At right angles through each housing part 1, 2 respectively, three bores extend in which quartz bars 14, 15 respectively are provided whose ends 18, 19 respectively are situated near the process chamber 3. The bores are positioned such that the end parts of the quartz bars 14, 15 are partly shielded by the edge of a wafer 4, when the wafer 4 is located centrally in the process chamber 3. In the present exemplary embodiment, the quartz bars 14, 15 are therefore arranged on the edge of the process chamber 13, at positions in a staggered relation of 120 degrees relative to each other. The quartz bars 14, 15 respectively, extend from the first and the second housing part 1, 2, respectively, to the first and second wall 11, 12, respectively. Extending through both walls 11, 12, respectively, are first and second light-transmitting head pieces 16, 17 respectively, of the quartz bars 14, 15. In use, at one of the walls 11, 12, respectively, light sources, not shown, are coupled to the three head pieces 16, 17, respectively, e.g. by means of glass fiber cables, in order to create light beams in the corresponding quartz bars 14, 15. Furthermore, in use, at the other wall 12, 11 respectively, light sensitive sensors, which are not shown, are coupled to the other three head pieces 17, 16, respectively, for instance by means of glass fiber cables, to detect light beams originating from the three quartz bars 15, 14.

Figure 2:
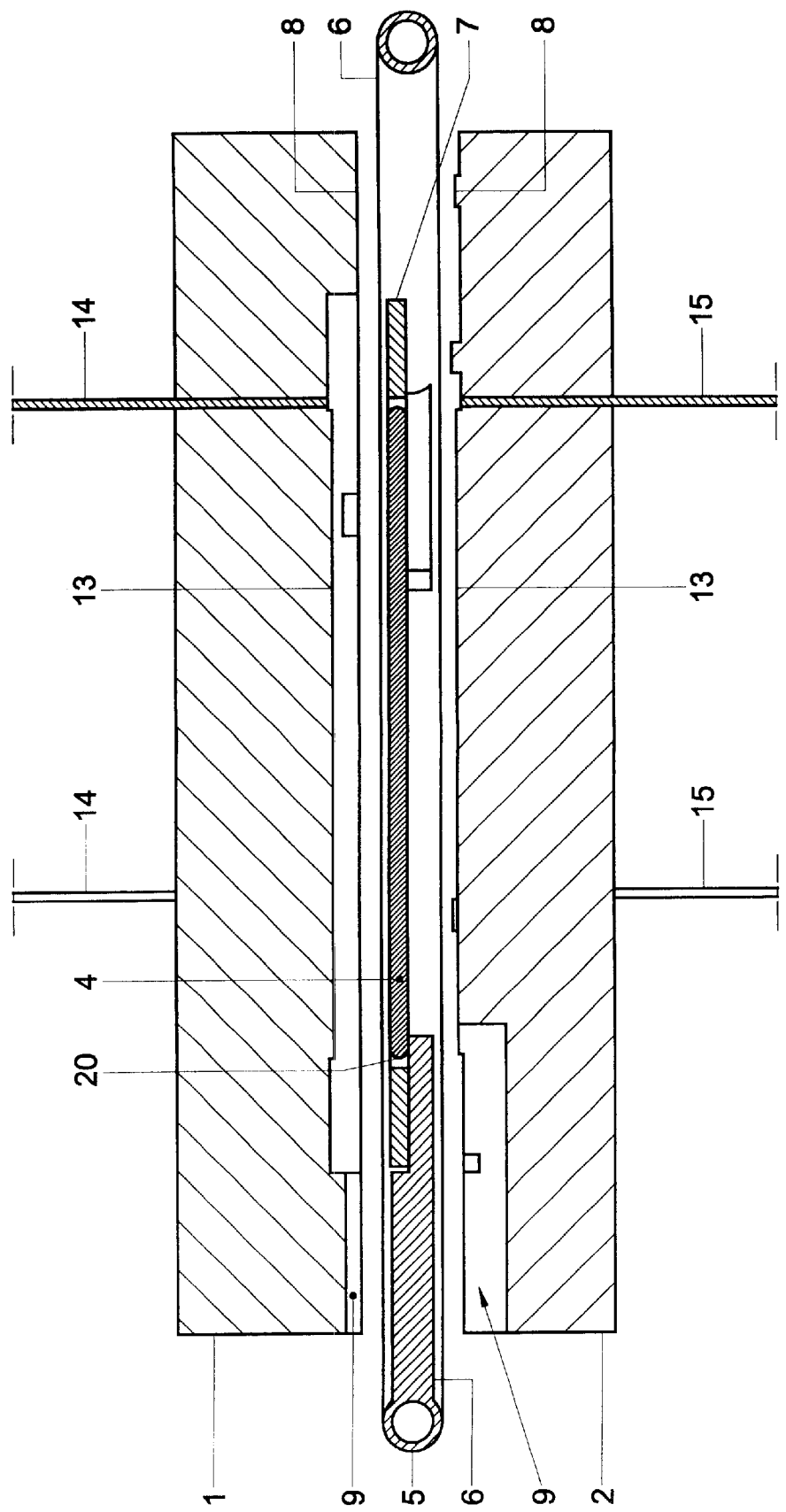
FIG. 2 shows a cross section along line II—II of FIG. 1 in which the exemplary embodiment is in an opened position.

In FIG. 2, the two housing parts 1, 2 are in a moved-apart position. In this position, by means of a wafer transport ring 5, the wafer 4 can be moved between the two housing parts 1, 2, for instance by means of a robot arm, which is not shown. The wafer 4 is then supported by ends of three support fingers 6, the support fingers 6 extending radially to the center of the transport ring 5. The central axes of the three support fingers 6 enclose angles of 120 degrees with each other. Around the wafer 4, is a centering ring 7 which is also supported by the support fingers 6.

Figure 3:
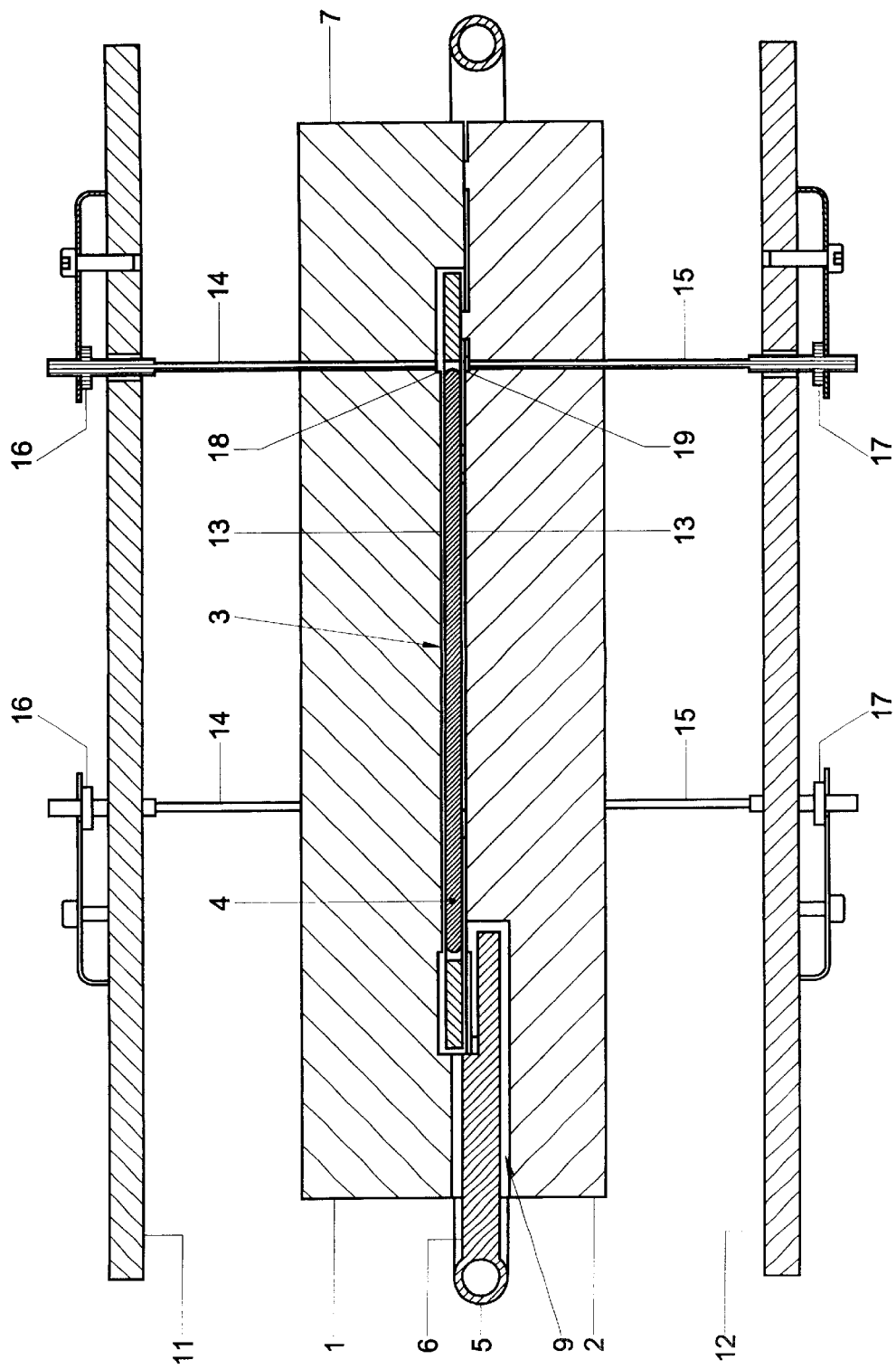
FIG. 3 shows a cross section similar to FIG. 2, in which the exemplary embodiment is in a closed position.

In FIG. 3, the two housing parts 1, 2 are in the position moved towards each other, the wafer 4 being received in the process chamber 3. The diameter of the wafer transport ring 5 is greater than the diameters of the two housing parts 1, 2, so that the housing parts 1, 2 do not contact the transport ring 5. The three support fingers 6 are received in the three pairs of wafer transport means receiving grooves 9, and the centering ring 7 is taken from the support fingers 6 by the second housing part 2.

While carrying out the processing of the wafer 4, the latter has to be accurately positioned in the process chamber 3 between the two processing surfaces 13. The wafer 4 is then positioned centrally in the process chamber 3 between the processing surfaces 13. In use, the position of the wafer 4 in the process chamber 3 is determined with the aid of three light beams being conducted via the quartz bars 14 or 15, at right angles through the process chamber 3. If the process chamber 3 is empty, each light beam can reach the opposite quartz bar 15, 14 respectively, without hindrance.

If a wafer 4 is positioned centrally in the process chamber 3, at least two of the light beams are at least partly shielded by a wafer edge 20. Consequently, each time two light beams are obstructed to the same extent. If a wafer 4 is not positioned centrally in de process chamber 3, the three light beams are obstructed to different extents. In that case, the wafer 4 can be so improperly positioned that at least two light beams are not at all, or, conversely, completely obstructed. When none of the sensors is obstructed, it is concluded that no wafer is present and the movement of the two housing parts towards each other is possible.

Figure 4:
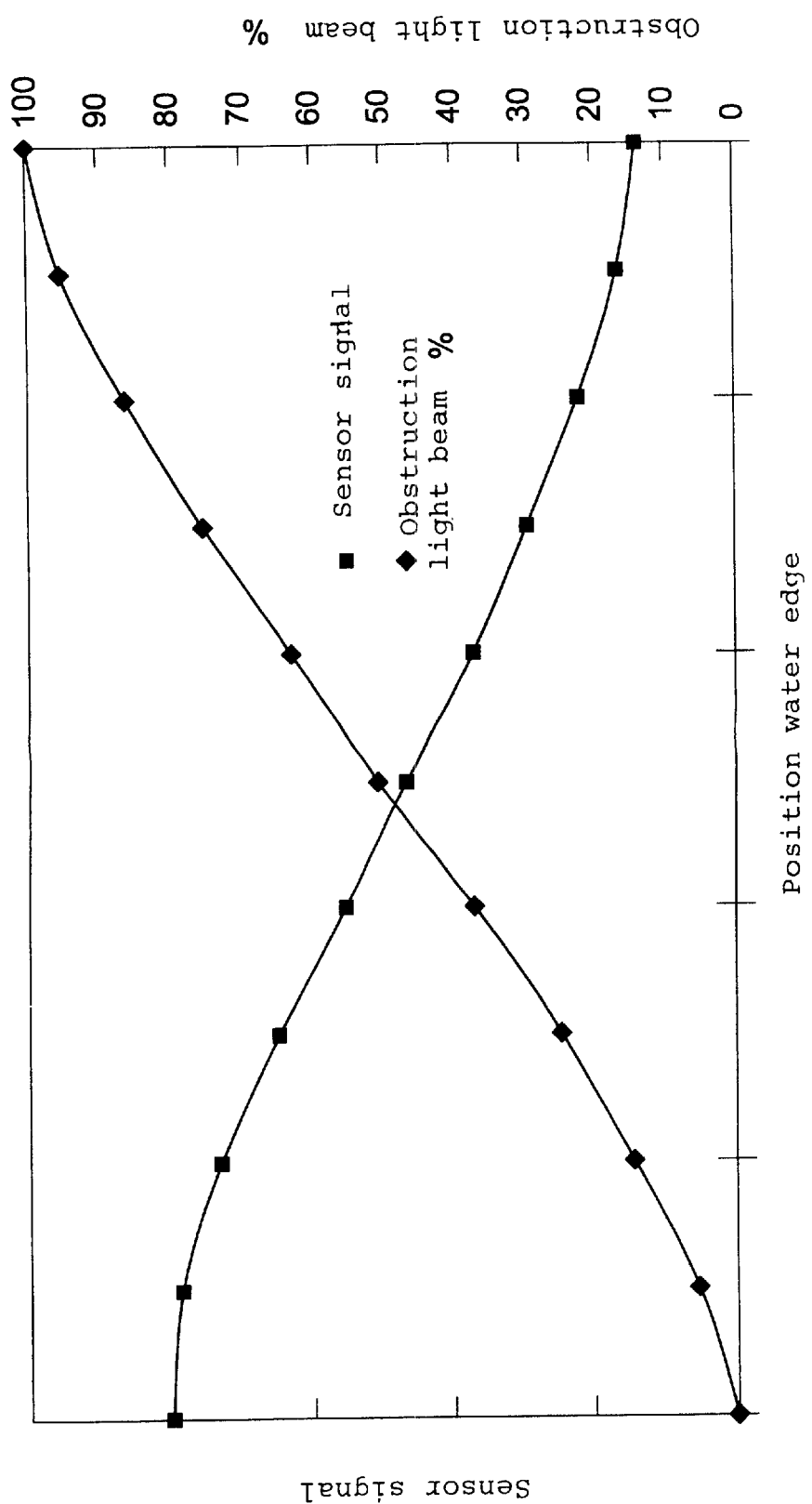
FIG. 4 shows a graph of a sensor signal and a light beam obstruction in relation to a wafer position in the process chamber.

The extent of obstruction of each light beam is measured by light sensitive sensors (not shown). To that end, these sensors are connected to the head pieces 17 or 16 which receive the light beams from the process chamber 3. Each sensor produces a sensor signal, for instance an electric current or voltage. This sensor signal depends on the extent of obstruction of the light beam detected by the sensor. This is represented in the graphs of FIG. 4. There, the sensor signal is at a maximum when the wafer edge 20 does not obstruct the light beam, vice versa.

A control (not shown) of the apparatus, for instance a microcontroller, can determine, on the basis of the three sensor signals, whether the wafer 4 is correctly positioned in the process chamber 3. Additionally, a rule in the decision making of the control may comprise, for instance, that incorrect positioning of the wafer 4 involves at least two sensor signals above a certain upper limit or below a certain lower limit. When there is incorrect positioning and when the housing parts are in the position moved away from each other, the control can still position the wafer 4 correctly with the aid of the wafer transport means 5, 6. Further, the control can end a wafer processing operation prematurely if the wafer 4 is not positioned correctly in the process chamber 3, for instance in that the wafer has been radially displaced from a correct central position during processing.

During processing, the wafer 4 can be rotated in the process chamber 3 by rotation means which are not shown, such as for instance influent gas, thus creating a gas bearing. The rotation of the wafer 4 can be measured with the aid of one of the light beams mentioned and a notch, provided on the wafer edge 20. The currently used wafers 4 usually comprise such a notch, with which the crystal orientation of the semiconductor material from which the wafers are made is indicated. The light beam, which is at least partly obstructed by the wafer edge 20 in a first rotation position of the wafer 4, reaches the notch after a rotation of the wafer to a second rotation position, such that the notch passes the light beam completely. Upon continuous rotation of the wafer 4, the wafer 4 is periodically in the second rotation position, so that the light beam is passed with a periodically changing light intensity. The sensor which detects this light beam produces a periodically changing sensor signal as a consequence of the period in the measured light intensity. On the basis of this sensor signal, the control mentioned can determine the rotational speed of the wafer 4. Using at least a second sensor, also the direction of rotation of the wafer 4 can be easily monitored. In that case, the sequential order in which the different sensors detect the notch is determined.

As the control can determine the rotational speed of the wafer during processing in the process chamber 3, the control can verify whether the wafer 4 undergoes a desired rotation. Furthermore, the control can decide whether a desired rotational speed has already been achieved before processing is started. In this way, the control can prevent processing taking place while the wafer 4 is rotating at an undesired speed. The control can furthermore determine whether the rotation of the wafer 4 has stopped after processing, so that the wafer 4 can be taken from the process chamber 3 by the wafer transport means 5, 6 without damage.

It will be clear that the invention is not limited to the embodiment described but that various modifications are possible within the framework of the invention.

Thus, the invention can be applied in every apparatus for processing wafers, in particular in apparatuses provided with at least one processing position 3 for processing a single wafer 4.

Further, use can be made of a different method of detection than optical detection, such as for instance pneumatic or acoustic detection of the wafer edge 20.

In the exemplary embodiment described, the optical coupling means 14, 15, 16, 17 are made of quartz, but they can also be made of a different optically conductive material, depending on the processing operation to be carried out and the resistance of the material to the processing operation.

A control of the apparatus can carry out many different tasks, for instance the control of motors which move wafer transport means 5, 6 and the movable housing parts 1, 2, or the operation of valves for the adjustment of gas flows of processing gases. Furthermore, the control can make a number of decisions on the basis of a measured position and/or rotation of the wafer in the process chamber, such as a change in the processing temperature, or the adjustment of gas flows which are fed into the process chamber. To a skilled person, it will be clear how means, such as motors, gas conduits, electronics and the controls described, necessary for the functioning of the apparatus, can be implemented.

What is claimed is:

1. Apparatus for thermally processing a wafer at an elevated temperature, the apparatus having at least one processing position, the or each processing position being bounded at least on one side by a housing part which, during use, is at an elevated temperature, characterized in that the apparatus is provided with measuring means for determining the position of a wafer in the processing position prior to and/or during processing, the measuring means being provided with at least one signal processor and at least one signal conductor, the or each signal processor being located at a distance from the processing position in an area of lower temperature, the signal conductor extending through or over the housing part being at an elevated temperature and extending from a measuring point in or near the processing position to the signal processor for transmitting to the signal processor contactlessly obtained measuring signals coming from the measuring point, while the at least one signal conductor, at least the part extending through or over the housing part being at an elevated temperature, is heat resistant.

2. An apparatus according to claim 1, characterized in that on opposite sides of the or each wafer processing position housing parts are present being at an elevated temperature.

3. An apparatus according to claim 2, characterized in that signal conductors extend through or over both housing parts, the signal conductors, at least the parts extending through or over the housing parts being at an elevated temperature, being heat resistant.

4. An apparatus according to claim 3, characterized in that the signal conductors extending through or over a first housing part are connected to a signal source, while the signal conductors extending through or over a second housing part are connected to a signal processor.

5. An apparatus according to claim 4, characterized in that the signal source is a light source.

6. An apparatus according to claim 4, characterized in that:
the or each signal processor comprises a pneumatic or acoustic pressure sensor, the or each signal conductor, at least the part extending through a housing part being at an elevated temperature, comprising in said housing part a fluid passing channel, which channel is in fluid communication with the pneumatic or acoustic pressure sensor; and
the signal source comprises a pneumatic pressure source or a sound source.

7. An apparatus according to claim 6, characterized in that:
a said housing part, being at an elevated temperature during use, is at a temperature which is higher than 200° C.; and
a said housing part, being at an elevated temperature during use, is at a temperature which is higher than 400° C.

8. An apparatus according to claim 7, wherein:
in said housing part gas feed channels are arranged for forming a gas bearing in the processing position, the apparatus being provided with a control comprising or being in communication with the or each signal processor, the control being arranged for regulating the gas flow in the gas feed channels, the gas flow being regulated depending on measuring signals measured by the signal processor, such that, during processing, the wafer maintains the correct position; and
the gas flows for forming the gas bearing are such that, during processing, the wafer rotates, the control being arranged for determining, depending on the measuring signals processed by the signal processor, the rotational speed of the wafer, the control being arranged for regulating the gas flow for obtaining the desired rotational speed.

9. An apparatus according to claim 8, characterized in that:
the apparatus is provided with at least three measuring points;
the measuring points are located at the intended position of the wafer edge in the processing position; and
the signal processor is arranged for determining the extent to which the measuring point is covered by the wafer being in the processing position.

10. An apparatus according to claim 4, characterized in that:
the or each signal processor comprises an optical sensor, the or each signal conductor, at least the part extending through or over a housing part being at an elevated temperature, being manufactured from light conducting, heat resistant material;
the light conducting, heat resistant material is quartz glass;
the signal source is a light source; and
the signal conductors also extend outside a housing part being at an elevated temperature and at least at that place are designed at least partly as glass fiber cables.

11. An apparatus according to claim 10, characterized in that:
a said housing part, being at an elevated temperature during use, is at a temperature which is higher than 200° C.; and
a said housing part, being at an elevated temperature during use, is at a temperature which is higher than 400° C.

12. An apparatus according to claim 11, wherein:

in said housing part gas feed channels are arranged for forming a gas bearing in the processing position, the apparatus being provided with a control comprising or being in communication with the or each signal processor, the control being arranged for regulating the gas flow in the gas feed channels, the gas flow being regulated depending on measuring signals measured by the signal processor, such that, during processing, the wafer maintains the correct position; and the gas flows for forming the gas bearing are such that, during processing, the wafer rotates, the control being arranged for determining, depending on the measuring signals processed by the signal processor, the rotational speed of the wafer, the control being arranged for regulating the gas flow for obtaining the desired rotational speed.

13. An apparatus according to claim 12, characterized in that:

the apparatus is provided with at least three measuring points;

the measuring points are located at the intended position of the wafer edge in the processing position; and the signal processor is arranged for determining the extent to which the measuring point is covered by the wafer being in the processing position.

14. An apparatus according to claim 2, wherein the one and the other housing part, being at an elevated temperature during use, are arranged for movement away from and towards each other, the apparatus being provided with a control comprising or being in communication with the or each signal processor, the control being arranged for operating the movement towards and away from each other of the first and the second housing parts, while the control can solely give a command for the movement toward each other of the housing parts when the signal processor determines that the wafer is in the correct position or when the signal processor determines that there is no wafer present in the processing position.

15. An apparatus according to claim 14, characterized in that the control is arranged for controlling the transporting means on the basis of the measuring signals for correcting the position of the wafer, so that the wafer obtains the desired position.

16. An apparatus according to claim 1, characterized in that the or each signal processor comprises an optical sensor, the or each signal conductor, at least the part extending through or over a housing part being at an elevated temperature, being manufactured from light conducting, heat resistant material.

17. An apparatus according to claim 16, characterized in that the light conducting, heat resistant material is quartz glass.

18. An apparatus according to claim 16, characterized in that the signal conductors also extend outside a housing part being at an elevated temperature and at least at that place are designed at least partly as glass fiber cables.

19. An apparatus according to claim 1, characterized in that the or each signal processor comprises a pneumatic or acoustic pressure sensor, the or each signal conductor, at least the part extending through a housing part being at an elevated temperature, comprising in said housing part a fluid passing channel, which channel is in fluid communication with the pneumatic or acoustic pressure sensor.

20. An apparatus according to claim 1, characterized in that a said housing part, being at an elevated temperature during use, is at a temperature which is higher than 200° C.

21. An apparatus according to claim 20, characterized in that a said housing part, being at an elevated temperature during use, is at a temperature which is higher than 400° C.

22. An apparatus according to claim 1, wherein in said housing part gas feed channels are arranged for forming a gas bearing in the processing position, the apparatus being provided with a control comprising or being in communication with the or each signal processor, the control being arranged for regulating the gas flow in the gas feed channels, the gas flow being regulated depending on measuring signals measured by the signal processor, such that, during processing, the wafer maintains the correct position.

23. An apparatus according to claim 22, wherein the gas flows for forming the gas bearing are such that, during processing, the wafer rotates, the control being arranged for determining, depending on the measuring signals processed by the signal processor, the rotational speed of the wafer, the control being arranged for regulating the gas flow for obtaining the desired rotational speed.

24. An apparatus according to claim 1, characterized in that the apparatus is provided with at least three measuring points.

25. An apparatus according to claim 24, characterized in that the measuring points are located at the intended position of the wafer edge in the processing position.

26. An apparatus according to claim 25, characterized in that the signal processor is arranged for determining the extent to which the measuring point is covered by the wafer being in the processing position.

\* \* \* \* \*